US008587288B2

(12) United States Patent
Bhavnagarwala et al.

(10) Patent No.: US 8,587,288 B2
(45) Date of Patent: Nov. 19, 2013

(54) DIGITAL INTERFACE FOR FAST, INLINE, STATISTICAL CHARACTERIZATION OF PROCESS, MOS DEVICE AND CIRCUIT VARIATIONS

(75) Inventors: Azeez Jennudin Bhavnagarwala, Danbury, CT (US); Stephen V. Kosonocky, Wilton, CT (US); Carl John Radens, LaGrangeville, NY (US); Kevin Geoffrey Stawiasz, Bethel, CT (US)

(73) Assignee: International Business Machines Corporation, Armonk, NY (US)

( * ) Notice: Subject to any disclaimer, the term of this patent is extended or adjusted under 35 U.S.C. 154(b) by 774 days.

(21) Appl. No.: 12/823,984

(22) Filed: Jun. 25, 2010

(65) Prior Publication Data

US 2011/0316569 A1    Dec. 29, 2011

(51) Int. Cl.
*G01R 31/3187* (2006.01)
(52) U.S. Cl.
USPC ............. 324/71.1; 324/750.3; 324/76.62
(58) Field of Classification Search
CPC ................................................ G01R 31/3187
USPC .......... 324/71.1, 76.62, 750.3, 765; 702/108, 702/110, 125; 714/724–731, 733–734
See application file for complete search history.

(56) References Cited

U.S. PATENT DOCUMENTS

| | | | |
|---|---|---|---|
| 4,357,703 A | 11/1982 | Van Brunt | |
| 4,519,078 A | 5/1985 | Komonytsky | |
| 5,929,650 A | 7/1999 | Pappert et al. | |
| 6,286,115 B1 | 9/2001 | Stubbs | |
| 6,424,583 B1 * | 7/2002 | Sung et al. | 365/201 |
| 6,557,117 B1 | 4/2003 | Wu et al. | |
| 7,085,668 B2 * | 8/2006 | Johnson | 702/117 |
| 7,124,341 B2 * | 10/2006 | Antley et al. | 714/734 |
| 7,307,441 B2 | 12/2007 | Sohn et al. | |
| 7,312,622 B2 | 12/2007 | Hyde et al. | |
| 7,400,130 B2 | 7/2008 | Naujokat et al. | |
| 8,248,094 B2 * | 8/2012 | Bhushan et al. | 324/762.01 |
| 2007/0007985 A1 | 1/2007 | Motomochi | |

FOREIGN PATENT DOCUMENTS

WO       WO/87/00292       1/1987

OTHER PUBLICATIONS

U. Diebold et al., "Contactless On-Chip AC I/O Wrap Test," IPCOM000123342D (Sep. 1, 1998).
N. Vijayaraghavan et al., "Novel Architecture for On-Chip AC Characterization of I/Os," IEEE International Test Conference, paper 33.2, pp. 1-10 (2006).

* cited by examiner

*Primary Examiner* — Arleen M Vazquez
*Assistant Examiner* — Robert Alejnikov, Jr.
(74) *Attorney, Agent, or Firm* — Preston Young; Michael J. Chang, LLC

(57) ABSTRACT

A Circuit architecture and a method for rapid and accurate statistical characterization of the variations in the electrical characteristics of CMOS process structures, MOS devices and Circuit parameters is provided. The proposed circuit architecture and method enables a statistical characterization throughput of <1 ms/DC sweep at <2 mV or <1 nA resolution accuracy of variations in voltage or current of the device under test. Salient features of proposed circuit architecture include a programmable ramp voltage generator that stimulates the device under test, a dual input 9-11 bit cyclic ADC that captures input and output DC voltage/current signals to/from the device under test, a 2 Kb latch bank that captures 9-11 bit streams for each measurement point in a DC sweep of programmable granularity and a clocking and control scheme that enables continuous measurement and stream out of digital data blocks from which the analog characteristics of the devices under test are reconstructed post measurement.

5 Claims, 5 Drawing Sheets

100

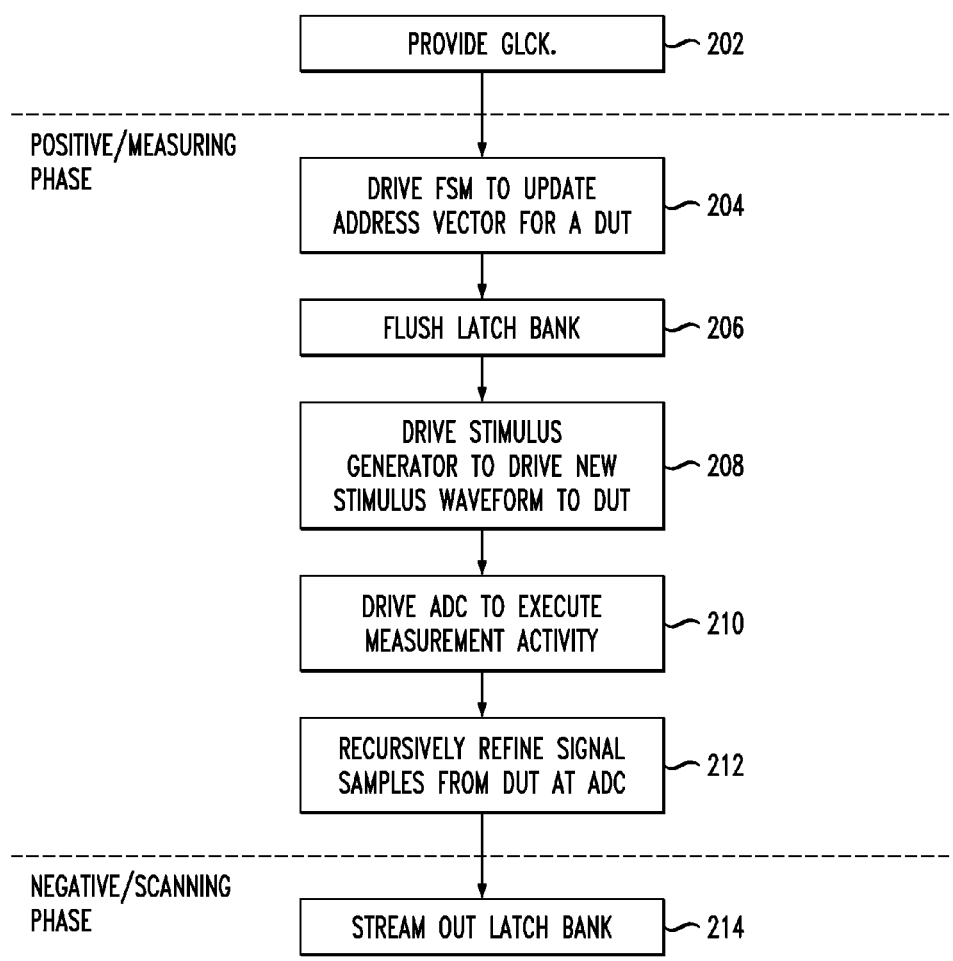

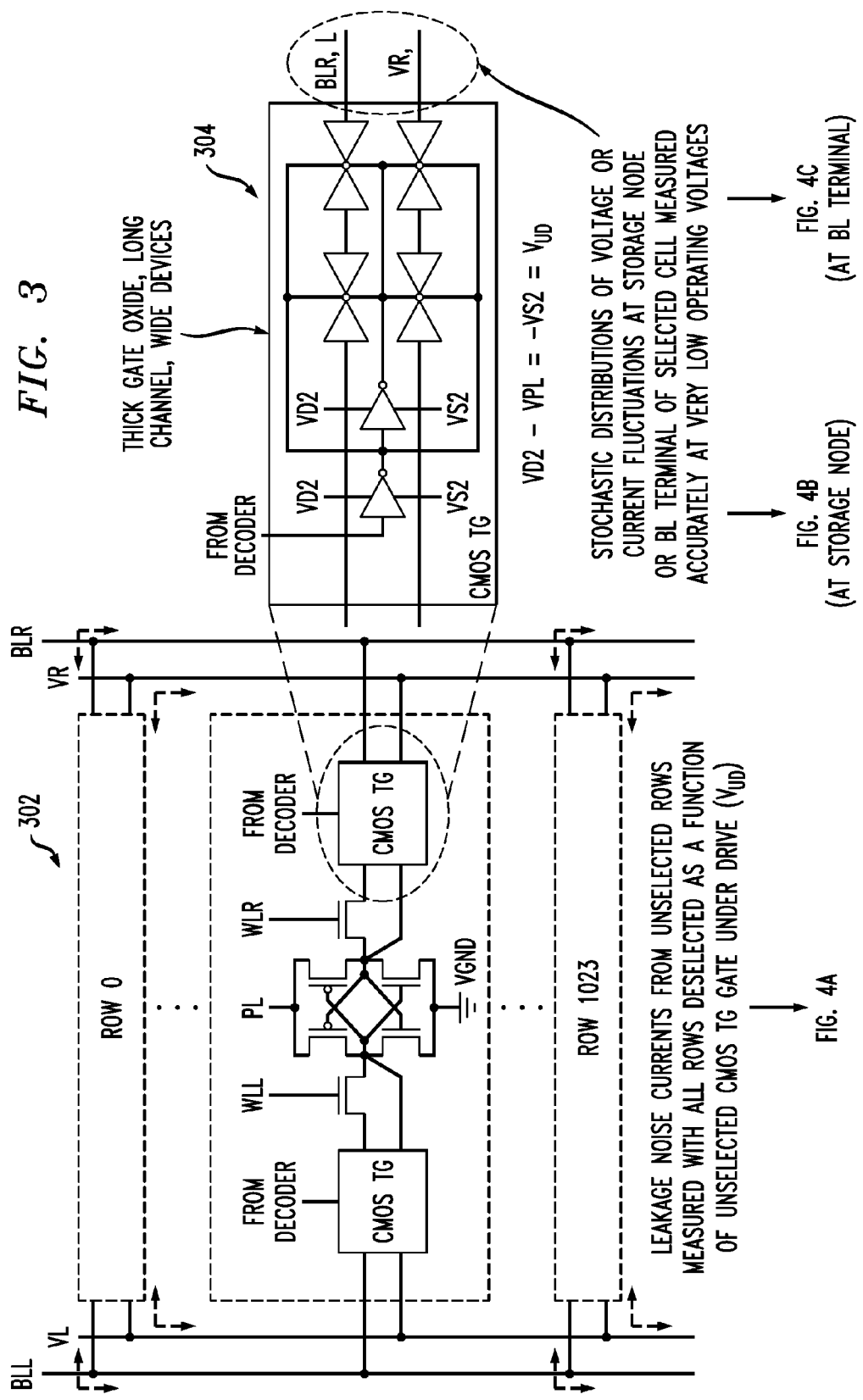

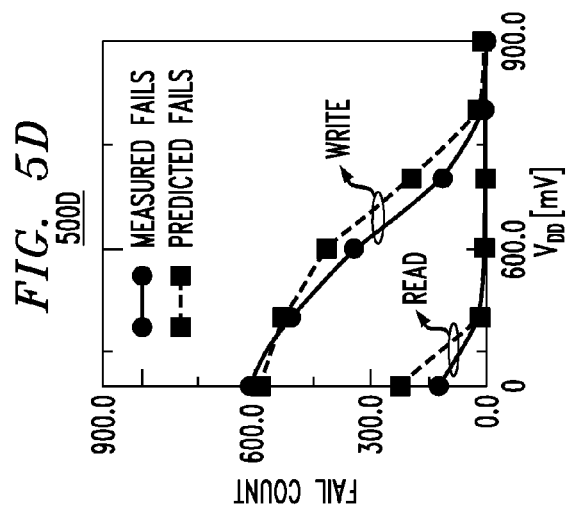
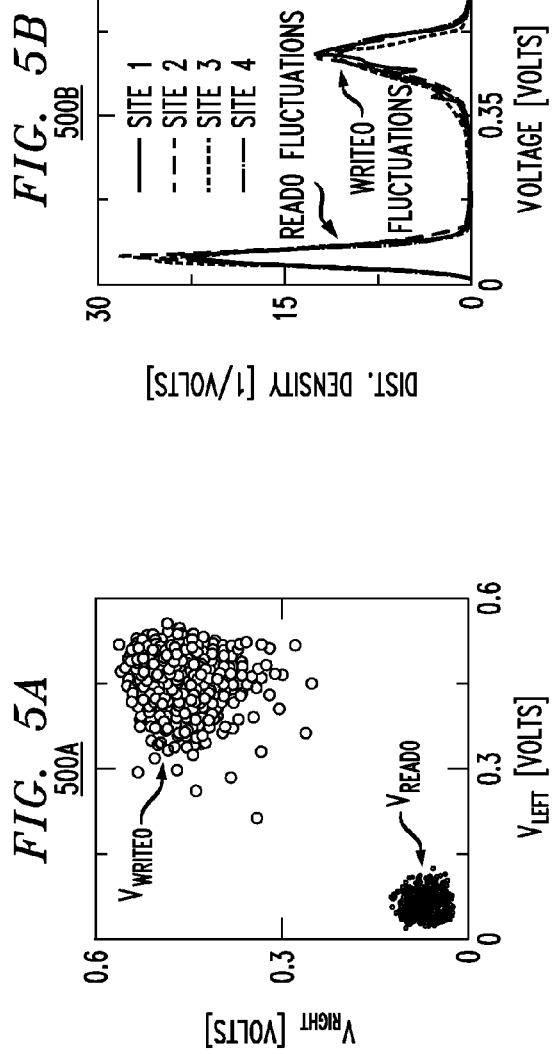
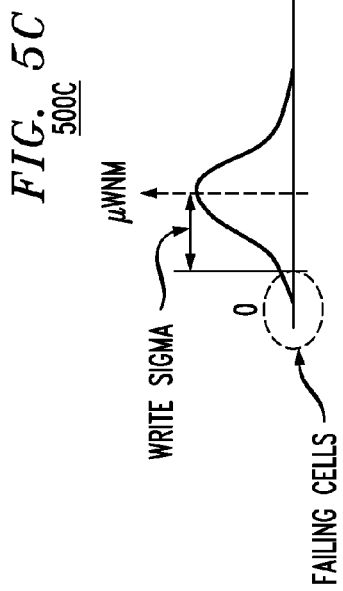

DIGITAL INTERFACE FOR FAST, INLINE, STATISTICAL CHARACTERIZATION OF PROCESS, MOS DEVICE AND CIRCUIT VARIATIONS

FIELD OF THE INVENTION

The present invention relates to fast, accurate statistical characterization of the variations in the electrical characteristics of CMOS process structures, MOS devices and circuit parameters.

BACKGROUND OF THE INVENTION

Increased variations in the electrical characteristics of complementary-metal-oxide semiconductor (CMOS) devices and process structures with scaling of device geometries produces fewer functional components and amongst components that function, fewer components that meet specifications for performance and leakage power. This increase in the electrical variability of CMOS devices and process structures can be controlled to a certain extent by iteratively refining the CMOS process integration to enable device parameters and their spreads to be centered precisely at regions that maximize satisfaction of yield, performance and leakage targets. The device parameter spreads induced by the intrinsic device variability can be minimized through the selection and optimization of device design attributes such as the distribution and concentration of dopant impurity atoms in the devices.

Iterative refining of the CMOS process requires a fast feedback between statistical characterization of device and process structures and a revised process integration sequence where implant energy, dose of small geometry yield detracting bitcell transistors for example, are incrementally adjusted to enable the process of the technology being developed to reach its targets. Traditional structures that provided this feedback on the chip kerf were built based on an outdated manufacturing paradigm from over 20 years ago that implicitly assumes an absence of random local variability and an absence of as large an impact of manufacturing variations (e.g., optical aberrations, variations in exposure, mask geometries, materials used, uniformity of resist thickness across wafer/lot, etc.) on electrical characteristics of small geometry structures.

Therefore, updated and improved techniques for statistical characterization of process and device structures are needed for process integration teams to rapidly assess both the mean values of electrical characteristics of devices and also their statistical spreads. 'Flycell'-type macros on the kerf that typically include a few to a few dozen structures for characterization do not provide adequate statistics for characterization since the "statistical confidence" of the sample size they offer are insufficient to accurately estimate the mean or the actual spreads of component characteristics in actual products. It is inefficient and expensive to dedicate additional non-product chip area to provide a greater quantity of "Flycell" test structures to improve the statistical confidence in the characterization of the device spreads.

Given structures on the kerf that are repeated at least a few thousand times (minimum to enable a hardware-based three sigma statistical characterization), the time consumed in characterizing the electrical characteristics during technology development can be very significant for a wafer start given the large number of such structures (e.g., several dozen process structures, several dozen device structures and several dozen circuit structures) and each of their individual sample sizes. Measurement times using standard parametric testers (again a product of an outdated manufacturing paradigm from over 20 years ago) inline (between manufacturing steps) can consume several hundred milliseconds to over a second for each unique measurement.

Thus, for example, getting a single DC measurement from 1,000 samples per chip for each of 100 (process, device and circuit) structures can take as long as 1,000 samples×100 structures×700 milliseconds (ms) or 20 hours for a single chip. Multiplying this number by 40 chips per wafer and 12 wafers per lot results in an overhead of 400 days for a single lot, which is unacceptable.

In addition, the number of test pad structures in the conventional characterization follows the number of devices, or samples. Therefore, the total chip area consumed by the conventional test structure will be proportional to the number of devices tested, and becomes unworkable in the case of, e.g., 1,000 samples per chip. Clearly, the economics do not permit manufacturing semiconductor components using paradigms that are carried over from the past.

SUMMARY OF THE INVENTION

A Circuit architecture and a method for rapid and accurate statistical characterization of the variations in the electrical characteristics of CMOS process structures, MOS devices and Circuit parameters is provided. The proposed circuit architecture and method enables a statistical characterization throughput of <1 ms/DC sweep at <2 mV or <1 nA resolution accuracy of variations in voltage or current of the device under test. Salient features of proposed circuit architecture include (i) a programmable ramp voltage generator that stimulates the device under test, (ii) a dual input 9-11 bit cyclic ADC (in a preferred embodiment of the invention) that captures input and output DC voltage/current signals to/from the device under test, (iii) a 2 Kb latch bank that captures 9-11 bit streams for each measurement point in a DC sweep of programmable granularity and (iv) a dual phase clocking and control scheme that enables continuous measurement and stream out of digital data blocks from which the analog characteristics of the devices under test are reconstructed post measurement.

In another aspect of the invention, a method for statistical characterization of a plurality of devices on a chip is provided. The method includes the following steps. On-chip, a stimulus generator and a dual input analog to digital converter, a scannable latch bank are provided. A two-phase global clock signal is provided. In response to a first phase of the clock signal, the following steps are performed. The on-chip stimulus generator is used to stimulate a DC electrical response from a device under test. The on-chip analog to digital converter is used to measure the DC electrical response from the device under test. In response to a second phase of the clock signal, the following step is performed. The latch bank is streamed out.

A more complete understanding of the present invention, as well as further features and advantages of the present invention, will be obtained by reference to the following detailed description and drawings.

BRIEF DESCRIPTION OF THE DRAWINGS

FIG. 2 is a diagram illustrating an exemplary methodology for statistical characterization of a plurality of devices on a chip using a chip diagnostic system such as the chip diagnostic system of FIG. 1 according to an embodiment of the present invention;

FIG. 3 is a diagram illustrating an exemplary static random access memory (SRAM) fluctuation monitor (SFM) test structure according to an embodiment of the present invention;

FIGS. 5A-D are graphs illustrating fluctuations in the Read and Write voltages on the right and left sides of cells of the test structure of FIG. 3 with their correlation coefficients.

DETAILED DESCRIPTION OF PREFERRED EMBODIMENTS

Described herein is a "lab-on-a-chip" diagnostic system and method for use thereof that enables rapid, accurate and inline (during fabrication) DC statistical characterization of any process structure, metal-oxide semiconductor (MOS) device or circuit parameter with a universal test and characterization protocol that is independent of the structure being characterized. Conventional chip testers require off-chip drivers to stimulate the device under test and off-chip measurement of electrical response of the device under test. As will be described in detail below, the present techniques combine both of these functions on-chip and synchronize their function with a single off-chip digital clock, by recognizing that most of the time consumed in measurements using conventional testers is in off-chip communication and stabilization of signals. Both of these are eliminated by stimulating, and encoding the device under test (DUT) response with on-chip analog and digital blocks as described below. Speedups exceeding 2-3 orders of magnitude can thus be achieved as described below. The present chip diagnostic system also offers chip area savings by reduction and elimination of dedicated test pad structure for thousands of devices.

Figure 1:
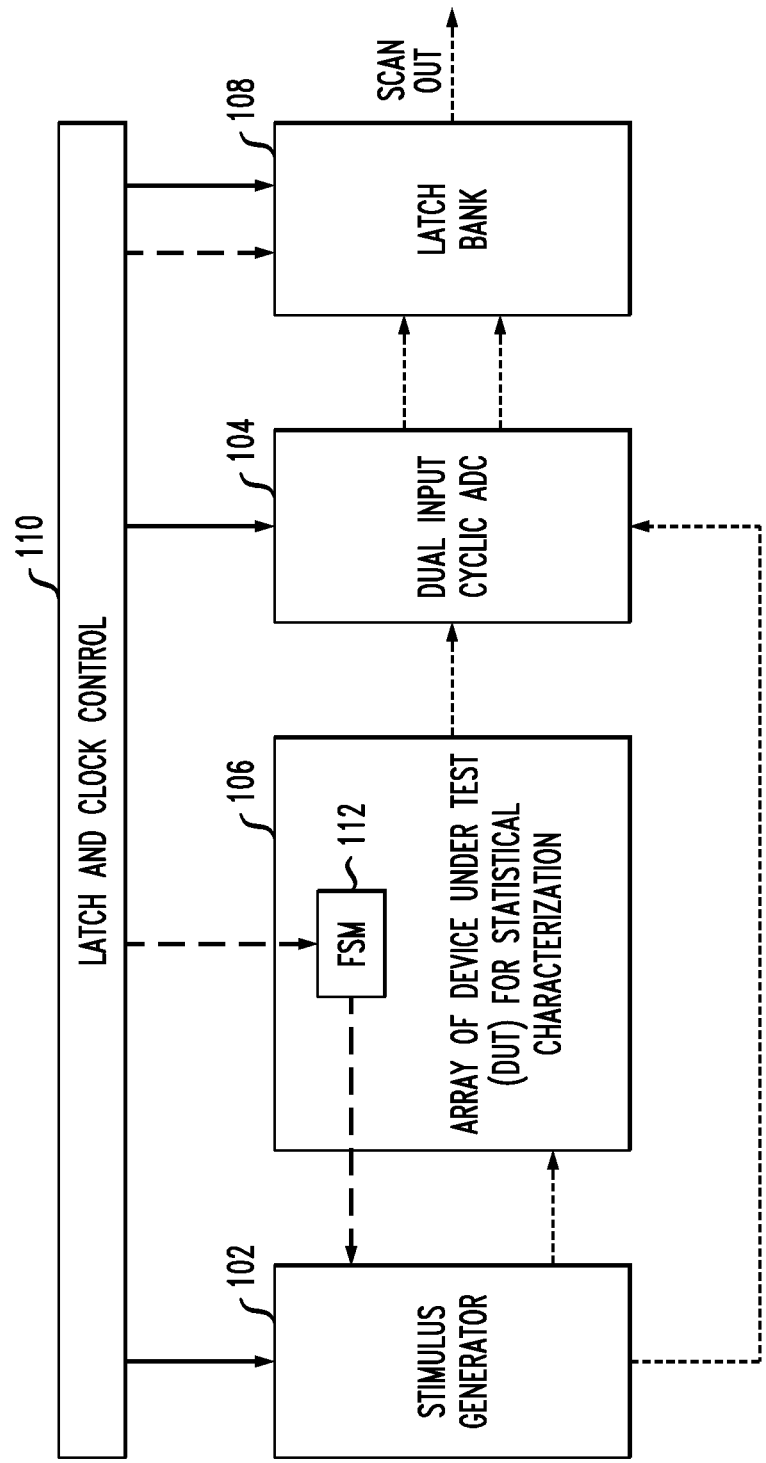
FIG. 1 is a diagram illustrating an exemplary chip diagnostic system according to an embodiment of the present invention.

FIG. 1 is a diagram illustrating a chip diagnostic system 100. In general, diagnostic system 100 can be used to take inline measurements using on-chip signals to create digital data. The digital data can be compiled for statistical characterization of any process structure, MOS device or circuit parameter. By comparison, conventional parametric or digital testers (such as those mentioned above) are unacceptably slow since they require off-chip stimulus and off-chip measurement, and are expensive since they consume significant inline manufacturing time and test resources that are unique to the structures being characterized.

System 100 comprises an on-chip stimulus generator 102 and an on-chip dual input cyclic analog to digital converter (ADC) 104 configured to stimulate and measure, respectively, an array of devices under test (DUT) 106 and an on-chip latch bank 108. Stimulus generator 102, ADC 104 and latch bank 108 are driven by a global clock (gclk) input from latch and clock control block 110, as indicated by the solid lines in FIG. 1.

Stimulus generator 102 can comprise any on-chip circuitry that in response to (gclk) signal input (i.e., from control block 110, see below) can stimulate a DC electrical response from DUT 106. According to an exemplary embodiment, stimulus generator 102 comprises a standard voltage ramp generator. Voltage ramp generators are known to those of skill in the art and thus are not described further herein The option might also be included to program in the nature of the stimulus of the DUT (signal voltage swing, slew rate and the number of data points on the voltage swing) using a scan-chain ADC 104 can comprise any on-chip circuitry configured to convert continuous analog signals (i.e., DC electrical signals from DUT 106) to discrete digital values. Analog to digital converters are known to those of skill in the art and thus are not described further herein. The output of system 100 labeled "scan out" is digital data relating to the statistical characteristics of DUT 106. ADC 104 is a dual input circuit receiving as input both stimulus data from stimulus generator 102 and DC electrical signals from DUT 106 (i.e., the stimulus and the DUT response to the stimulus, respectively, so as to link the electrical signal with the corresponding stimulus), as indicated by the dotted lines in FIG. 1. According to an exemplary embodiment, ADC 104 comprises an 11 bit cyclic ADC. ADC 104 also comprises a dual sample-and-hold input circuit so that both ramp input voltage and signal output voltage are sampled at the same time.

Advantageously, as compared with conventional techniques, system 100 does not require 1) external (off-chip) application of slow DC voltage or current ramps to stimulate a structure under test for statistical characterization or 2) external (off-chip) measurement of electrical DC response of structure under test for statistical characterization. Namely, both stimulus generator 102 and ADC 104 are on-chip circuit blocks that, as will be described in detail below, can be used to stimulate and measure, respectively, the DC electrical response of a given DUT 106 in less than a few milliseconds.

Latch bank 108 comprises that areare scannable and compatible with clocked systems. Data latches are known to those of skill in the art and thus are not described further herein System 100 also comprises on-chip circuitry to select a particular DUT from the array. See for example, finite state machine (FSM) 112 which can be configured to update an address vector that selects a particular DUT. Finite state machine circuitry is known to those of skill in the art and thus is not described further herein. In some complex chip/circuit configurations, leakage from unselected devices can affect measurement of the signal from the DUT by the diagnostic system especially during low voltage operations. Advantageously, techniques are provided herein for suppressing leakage from these unselected devices. See for example, FIGS. 3, 4A-C and 5A-D, described below.

Control block 110 coordinates the activity of the various components of system 100 by providing (gclk) signal input to latch bank 108, FSM 112 and stimulus generator 102 (i.e., by way of FSM 112). As will be described in detail below, system 100 requires only a (slow) clock as the primary input and is independent of structure being measured. All other programmable options are specified during a scan operation before statistical test of the DUT actually begins. According to an exemplary embodiment, an ~N bit (programmable) frequency divider (not shown) in control block 110 drives the slow clock to FSM 112 which then provides the slow clock signal to stimulus generator 102 See, for example, the dashed line in FIG. 1. The dashed line also indicates that the slow clock signal, e.g., by way of the ~N bit (programmable) frequency divider, is provided to (clocked) latch bank 108 (see description of positive and negative phase latch bank operation, below).

FIG. 2 is a diagram illustrating exemplary methodology 200 for statistical characterization of a plurality of devices on a chip using, e.g., chip diagnostic system 100 (described in conjunction with the description of FIG. 1, above). As highlighted above, a global clock input drives on-chip stimulus generator 102, ADC 104 and latch bank 108. As such, stimulus generator 102, ADC 104 and latch bank 108 are all synchronized with a single, e.g., off-chip, digital clock. Namely, in step 202, the global clock input is provided. According to an exemplary embodiment, a two-phase off-chip digital clock provides the input with every first phase (also referred to herein as a positive phase) being a measuring phase (scan mode) and every second phase (also referred to herein as a negative phase) being a data dumping phase.

In one exemplary embodiment, a micro second clock cycle time is employed. This clock cycle time is multiplied N times (e.g., wherein N ~64, but could be higher or lower depending on the technology and the programming preferences of the fabrication implementing the testing scheme).

In a measuring phase, the positive phase of the slow clock (i) drives the FSM 112 to update the address vector that selects a given DUT (step 204), (ii) drives the latch bank 108 to be flushed so as to begin a new scan operation of the data points stored from the previous address (assuming that a previous scan has been made and the latch bank contains data from a previous device) (step 206) and (iii) drives the stimulus generator 102 to begin driving a new stimulus waveform to the DUT at the new address location (step 208).

In step 210, the positive phase of the slow clock also drives the ADC 104 to execute measurement activity. The ADC 104 preferably comprises a sample-and-hold input circuit (as described above) in which the signal samples (from the DUT) are captured and recursively refined.

In step 212, according to an exemplary embodiment, the signal samples are recursively refined using a cyclic k-bit methodology (wherein k is from seven to 11 bits). There is a trade-off in the number of bits used given the yield fall-off with more bits and the higher resolution of the ADC 104 with higher k. In one example, a desired resolution is 10 bits with a 10 volt swing.

In step 214, these k-bit chunks are driven from the ADC 104 into the latch bank 108 for a programmable number of samples (i.e., preferably 16-128 samples) of k bits per DC sweep for both input stimulus (from stimulus generator 102) and output response of the DUT. The size of the latch bank 108 is thus determined by the resolution of the ADC (k) and the maximum number of (programmable) samples per sweep.

In the negative phase of the slow clock, all ADC and stimulus generating activity is disabled and the scan operation of the latch bank is enabled. In step 216, the latch bank is streamed out in pairs of k-bit chunks for each stimulus and response signal sample operation for all of the programmable number of samples. Thus, according to an exemplary configuration of the latch bank design, at 11 bits/sample×2 (stimulus and response)×128 sample points per DC sweep=2, 816 latches are scanned out during the scan phase.

According to an exemplary embodiment, the cycle time that is input by the system is typically from about 0.25 microseconds (μs) to about 1.0 μs (from about one megahertz (MHz) to about five MHz) translating into a slow clock cycle time of from about one millisecond (ms) to about two ms, given the number of latches that need to be scanned out in a half cycle and given the number of samples that need to be measured by the k-bit resolution ADC block (e.g., 1-2K clock cycles assuming an 11 bit resolution for 128 samples per sweep).

A DC measurement accomplished in from about one ms to about two ms with a 7-11 bit ADC resolution provides a vast improvement over conventional techniques which typically consume several hundred milliseconds (in the best case) to a few seconds (in the worst case) of inline measurement time. The present techniques thus improve data throughput by 2-3 orders of magnitude, significantly impacting wafer start time consumed during technology development and time to accurately characterize the stochastic distributions of small geometry device parameters to shorten the time to center the process.

The output of the instant process, using the present diagnostic system is continuously streaming digital data. This data can be processed off-chip to reconstruct analog waveforms of DUT response to programmed stimuli. Thus, the interface between chip and tester (diagnostic system) is entirely digital and does not require V-I cards to enable analog measurements (as is the case with conventional techniques).

As highlighted above, the measurement of a DUT may undesirably be affected by leakage from unselected devices on the chip, especially with low operating voltages, i.e., in the subthreshold regime. Techniques are provided herein to suppress this leakage. FIG. 3 is a diagram illustrating an exemplary static random access memory (SRAM) fluctuation monitor (SFM) test structure 302. SFM test structure 302 consists of N (1024) identical cells per macro (labeled "row 0" through "row 1023") with the cell storage nodes wired out through a hierarchy of addressable, wide, high-, thick-oxide (i.e., thick gate oxide (TG) CMOS pass-gates that are driven by separate power supplies to suppress leakage from unselected pass-gates to the measured cell node. This enables accurate characterization of current or voltage fluctuations in the cell under test down to very low operating voltages in the subthreshold regime. An enlarged view 304 of one of the pass-gates is also shown. In FIG. 3, left and right bit lines (BLL and BLR) and word lines (WLL and WLR) are labeled.

Figure 4A:
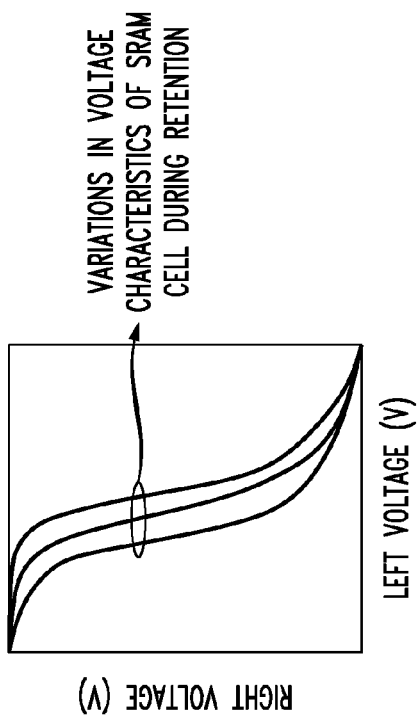
FIGS. 4A-C are graphs illustrating distributions of static voltage characteristics for Read, Write and Retention operations for the test structure of FIG. 3 from a one kilobyte sample according to an embodiment of the present invention.
Figure 4C:
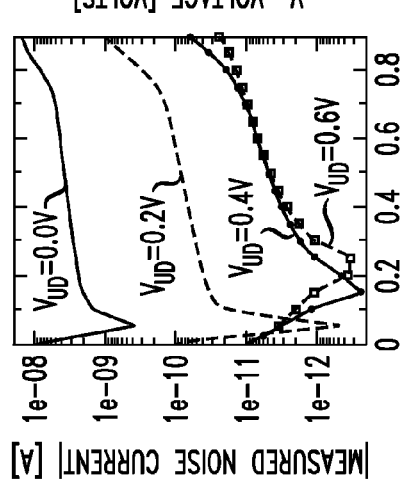
Figure 4B:
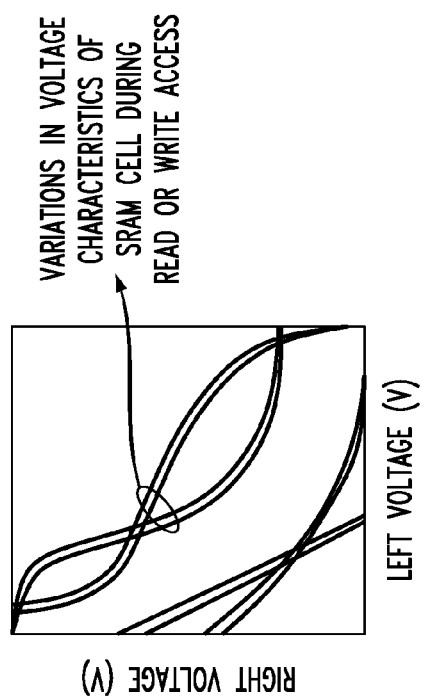

The stochastic distributions of Read, Write and Retention margin are measured as the DC limiting case in FIG. 3, which is useful in understanding the impact of cell terminal biasing on time-independent cell DC margin fluctuations and on cell transistor characteristics during technology development or during volume manufacturing. FIGS. 4A, 4B and 4C are graphs 400A, 400B and 400C, respectively, illustrating distributions of static voltage characteristics for Read, Write and Retention operations from a one kilobyte (kb) sample. FIGS. 5A, 5B, 5C and 5D are graphs 500A, 500B, 500C and 500D, respectively, illustrating fluctuations in the Read0 and Write0 voltages on the right and left sides of the cells with their correlation coefficients. FIG. 5A demonstrates that the distributions observed in FIG. 4A-C are overwhelmingly random. FIG. 5B shows distributions of Read0 and Write0 voltages from four different sites and demonstrate the reproducibility of the measured stochastic distributions. The mean and sigma values of static noise margin (SNM) and write noise margin (WNM) are applied to an error function as shown in FIG. 5C to predict the read/write (R/W) fail count from a sample of 1024 cells. The comparison in FIG. 5D demonstrates excellent agreement. The accuracy is limited by sample size and marginal asymmetry in measured distributions.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A method for statistical characterization of a plurality of devices on a chip, the method comprising the steps of:
providing an on-chip stimulus generator, an on-chip dual input analog to digital converter, and an on-chip scannable latch bank;
providing a two-phase global clock signal;
in response to a first phase of the two-phase global clock signal, performing the steps of:

using the on-chip stimulus generator to stimulate a DC electrical response from a device under test;

using the on-chip dual input analog to digital converter to measure the DC electrical response from the device under test; and in response to a second phase of the two-phase global clock signal, performing the step of:

streaming out the on-chip scannable latch bank.

2. The method of claim 1, where in response to the first phase of the two-phase global clock signal, further performing the step of:

flushing the on-chip scannable latch bank so as to begin a new scan operation of data points stored from a previous address, if the on-chip scannable latch bank contains data from a previous device.

3. The method of claim 1, wherein the step of using the on-chip stimulus generator to stimulate a DC electrical response from the device under test further comprises the step of:

using the on-chip stimulus generator to drive a new stimulus waveform to the device under test.

4. The method of claim 1, further comprising the step of: Providing an on-chip finite state machine.

5. The method of claim 4, further comprising the step of:

using the on-chip finite state machine to select the device under test.

* * * * *